United States Patent [19]

Chang et al.

[11] Patent Number: 5,201,990
[45] Date of Patent: Apr. 13, 1993

[54] PROCESS FOR TREATING ALUMINUM SURFACES IN A VACUUM APPARATUS

[75] Inventors: Mei Chang, Cupertino; Ashok Sinha, Palo Alto; Turgut Sahin, Cupertino; Alfred Mak, Union City; Cissy Leung, Fremont, all of Calif.

[73] Assignee: Applied Materials, Inc., Santa Clara, Calif.

[21] Appl. No.: 704,523

[22] Filed: May 23, 1991

[51] Int. Cl.$^5$ .......................... B44C 1/22; C23F 1/00; B05D 3/06
[52] U.S. Cl. .................................... 156/643; 156/656; 156/665; 427/576
[58] Field of Search ............... 156/643, 646, 656, 665, 156/345; 134/1, 26, 31; 204/192.32, 192.35; 427/38

[56] References Cited

U.S. PATENT DOCUMENTS 4,975,147 12/1990 Tahara et al. .................. 156/665 X
4,992,136 2/1991 Tachi et al. ......................... 156/643
5,035,751 7/1991 Nagashima et al. ............ 156/345 X Primary Examiner—William A. Powell
Attorney, Agent, or Firm—John P. Taylor

[57] ABSTRACT

A process is described for inhibiting the vaporization or sublimation of aluminum base alloy surfaces when exposed to temperatures in excess of 400° C. in a vacuum chamber used for the processing of semiconductor wafers. The process comprises treating such aluminum base alloy surfaces with a plasma comprising a nitrogen-containing gas selected from the group consisting of nitrogen and ammonia. When nitrogen gas is used, the plasma must also contain hydrogen gas. When the vacuum chamber being treated is intended to be used for the deposition of tungsten, the maximum flow of the nitrogen-containing gas into the chamber for the initial 10 seconds of the treatment process must be controlled to avoid impairment of the subsequent tungsten depositions in the chamber. After the treatment step, the cleaned and treated aluminum surface is preferably passivated with nitrogen ($N_2$) gas.

21 Claims, 1 Drawing Sheet

---

TREATING AN ALUMINUM SURFACE IN A VACUUM CHAMBER TO INHIBIT SUBSEQUENT SUBLIMATION OR VAPORIZATION OF ALUMINUM IN THE CHAMBER BY FLOWING A NITROGEN-CONTAINING GAS INTO THE CHAMBER AT A RATE OF AT LEAST 20 SCCM

|

IGNITING A PLASMA IN THE CHAMBER AND MAINTAINING IT AT A POWER LEVEL OF 100 TO 400 WATTS DURING THE GAS FLOW

|

MAINTAINING THIS TREATMENT FOR A PERIOD OF AT LEAST ABOUT 10 SECONDS

TREATING AN ALUMINUM SURFACE IN A VACUUM CHAMBER TO INHIBIT SUBSEQUENT SUBLIMATION OR VAPORIZATION OF ALUMINUM IN THE CHAMBER BY FLOWING A NITROGEN-CONTAINING GAS INTO THE CHAMBER AT A RATE OF AT LEAST 20 SCCM

IGNITING A PLASMA IN THE CHAMBER AND MAINTAINING IT AT A POWER LEVEL OF 100 TO 400 WATTS DURING THE GAS FLOW

MAINTAINING THIS TREATMENT FOR A PERIOD OF AT LEAST ABOUT 10 SECONDS

PROCESS FOR TREATING ALUMINUM SURFACES IN A VACUUM APPARATUS

BACKGROUND OF THE INVENTION

1. Field of the Invention

This invention relates to a treatment process for aluminum in a vacuum apparatus. More particularly, this invention relates to a process for treating exposed aluminum surfaces in a vacuum apparatus used for deposition and/or etching of materials on a semiconductor wafer.

2 Description of the Related Art

Aluminum and aluminum base alloys have been widely used as chamber materials in vacuum apparatus used for deposition and/or etching processes employed in the formation of integrated circuit structures on semiconductor wafers. Aluminum is a preferred vacuum chamber material both because of its relatively low cost and its non-reactivity with at least some of the chemicals used in such processes. For example, in CVD tungsten deposition, using $WF_6$ gas, aluminum has been used to form the heated susceptor because of its excellent heat conductivity and resistance to fluorine, even at temperatures as high as 525° C.

However, in certain processes, particularly CVD or PVD deposition processes, the inner surfaces of the vacuum chamber, including the aluminum surfaces within the chamber, become coated with materials which must be removed before further processing can be carried out in the chamber. The chemicals used in such cleaning steps, however, have been found to apparently also remove protective surfaces from the aluminum. This can result in vaporization or sublimation of aluminum from the cleaned aluminum surfaces when such surfaces are then exposed to temperatures above about 400° C. during subsequent processing. Such vaporization or sublimation, in turn, results in undesirable aluminum depositions and/or particle formation in the vacuum chamber during such subsequent processing.

For example, in tungsten CVD deposition, tungsten metal may deposit on the exposed surface of the heated susceptor. $NF_3$ or $SF_6$ plasmas have been used to remove such tungsten deposits, but this, in turn, results in deposition of residuals, such as fluorine residues. In the related application of one of us, Chang U.S. Ser. No. 07/398,689, filed Aug. 25, 1989, abandoned, assigned to the assignee of this invention, and cross-reference to which is hereby made, it was proposed to remove such fluorine residues by flowing a gaseous source of hydrogen into the chamber and igniting a plasma.

While this process successfully removed the fluorine residues, it has been discovered that in vacuum chambers cleaned in such a manner, subsequent processing, e.g., deposition or etching process, wherein the "cleaned" aluminum surfaces were exposed to temperatures in excess of about 400° C., apparently resulted in vaporization and/or sublimation of aluminum. This, in turn, resulted in undesirable aluminum particle formation and/or depositions of the aluminum or aluminum alloy on other surfaces in the vacuum chamber, such as the chamber walls.

It would, therefore, be advantageous to be able to remove undesirable residues in a vacuum chamber having aluminum surfaces therein without rendering such aluminum surfaces more susceptible to such undesirable vaporization or sublimation.

SUMMARY OF THE INVENTION

The invention comprises a process for treating the surfaces of aluminum and/or aluminum alloys in a vacuum chamber to prevent or inhibit vaporization or sublimation of such aluminum when subsequently exposed to temperatures in excess of 400° C. by treating such aluminum surfaces with a plasma comprising a nitrogen-containing gas selected from the group consisting of nitrogen and ammonia. The plasma must also contain hydrogen gas when nitrogen ($N_2$) gas is utilized as the nitrogen-containing gas. To avoid interference with subsequent deposition, the amount of such nitrogen-containing gas in the plasma should be initially limited during the treatment if subsequent deposition of tungsten is contemplated. After the treatment step, the cleaned and treated aluminum surface is preferably passivated using only nitrogen ($N_2$) gas.

BRIEF DESCRIPTION OF THE DRAWING

The sole drawing is a flowsheet illustrating the process of the invention.

DETAILED DESCRIPTION OF THE INVENTION

Vaporization or sublimation of aluminum base alloy surfaces, when exposed to temperatures in excess of 400° C. in a vacuum chamber used for the processing of semiconductor wafers, is inhibited in accordance with the invention by treating such aluminum base alloy surfaces with a plasma comprising a nitrogen-containing gas selected from the group consisting of nitrogen ($N_2$) and ammonia ($NH_3$). When nitrogen ($N_2$) gas is used as the nitrogen-containing gas, the plasma must also contain hydrogen, i.e., a mixture of nitrogen and hydrogen gas must be used.

By use herein of the term "aluminum base alloy" is meant an alloy containing from at least about 50 wt.% aluminum up to about 100% aluminum, with the balance comprising alloying metals and impurities.

The plasma is maintained in the vacuum chamber during the treatment at a power level ranging from about 100 to about 400 watts, when a chamber having a volume of about 6 liters is used. When a different volume vacuum chamber is utilized, however, the power level range of the plasma can be adjusted accordingly.

The pressure in the vacuum chamber during the treatment may range from as low as about 200 milli-Torr up to as high as about 2 Torr. The temperature in the vacuum chamber may range from about 150° C. to about 525° C. Higher temperatures may be used up to below the melting point of aluminum, provided that other materials in the chamber are capable of withstanding such an elevated temperature.

The flow of the nitrogen-containing gas into the vacuum chamber will vary, first of all, with respect to the volume of the vacuum chamber. Thus, the subsequently recited flow rates will assume a chamber volume of 6 liters and the actual flow rates for other chamber sizes may be adjusted accordingly.

The flow of the nitrogen-containing gas into the vacuum chamber may also vary based on the intended subsequent use of the vacuum chamber, because it has been discovered that the use of excessive amounts of the nitrogen-containing gas in the initial portion of the treatment may deleteriously affect subsequent processing, for example, subsequent deposition of tungsten in the chamber.

In accordance with the broadest aspects of the invention, when nitrogen ($N_2$) comprises the nitrogen-containing gas, the minimum flow of nitrogen into a 6 liter vacuum chamber will comprise a flow of about 20 standard cubic centimeters per minute (sccm), and preferably at least about 30 sccm. The maximum amount of nitrogen flowing into the vacuum chamber will depend upon other factors such as the capacity of the vacuum pump, but usually will not comprise a flow in excess of about 250 sccm of nitrogen.

When nitrogen ($N_2$) is used as the treating gas, hydrogen ($H_2$) is also flowed into the 6 liter chamber at the same time at a rate ranging from 250 to about 1000 sccm, with the maximum amount preferably not exceeding about 600 sccm, and most preferably about 500 sccm.

When the nitrogen-containing gas comprises ammonia ($NH_3$) the minimum flow rate into a 6 liter chamber will be about 40 sccm, preferably about 50 sccm, with the same factors affecting maximum flow rates as discussed above with respect to the flow of nitrogen.

However, as will be discussed below, a much lower maximum flow rate for the nitrogen-containing gas must be used during the first 10 seconds of the treatment when the chamber will be subsequently used for tungsten deposition, regardless of whether the treatment gas comprises ammonia ($NH_3$) or a mixture of $N_2$ and $H_2$.

The treatment with the nitrogen-containing gas is carried out for a minimum of about 8 seconds, and preferably for at least about 10 seconds. The treatment may be continued for an additional period of about 5 seconds, if desired. Longer treatment periods may be used, if desired, but have not been found to be needed to achieve the desired protection of the aluminum surfaces in the vacuum chamber.

In a particular embodiment wherein the vacuum chamber is to be subsequently used for the deposition of tungsten, in accordance with the invention, the maximum flow of nitrogen-containing gas into the vacuum chamber must be carefully controlled for at least about the first 10 seconds of the treatment to avoid impairment of the subsequent tungsten deposition, and a hydrogen-containing gas must be present during the treatment.

The following description, therefore, is limited to those applications where the subsequent use of the chamber necessitates a control of the initial flow of the nitrogen-containing gas, as well as the need for the presence of a hydrogen-containing gas during the treatment. The remaining parameters of plasma power level, pressure, and temperature remain the same.

In accordance with this embodiment of the invention, a vacuum chamber used for the deposition of tungsten is treated by flowing into the chamber, for at least the first 10 seconds, a controlled maximum amount of nitrogen-containing gas which will comprise not more than about 30 sccm of nitrogen ($N_2$), when nitrogen is the nitrogen-containing gas, or not more than about 50 sccm of ammonia ($NH_3$), when ammonia is the nitrogen-containing gas. These flow rates are again based on a chamber of 6 liter volume.

Furthermore, as stated above, in this embodiment as well, there must also be a source of hydrogen present in the chamber during the treatment. While ammonia has its own source of hydrogen, when using nitrogen ($N_2$) as the nitrogen-containing gas, a source of hydrogen gas, such as $H_2$ should also be flowed into the chamber. This flow may vary from as little as 50 sccm to as much as 300 sccm or even higher.

It should be noted with regard to the special low initial nitrogen-containing gas flow in this embodiment of the treatment step, to be used when subsequent tungsten deposition is contemplated, that the control of the maximum amount of nitrogen-containing gas allowed to flow into the chamber during the first 10 seconds is not related to the treatment of the aluminum surface, but rather is related only to the subsequent performance of the chamber during such a tungsten deposition. Control of the sublimation and/or vaporization of the aluminum will be controlled by the treatment even if the above recited maximum flow rate flow rate is exceeded. In fact, this is why the flow rate of nitrogen-containing gas is preferably extended beyond the first 10 seconds, and may even be increased, since at that point in time in the treatment, it has been determined that exceeding the indicated maximum flow rate of nitrogen-containing gas will not deleteriously affect subsequent tungsten deposition.

After treatment of the aluminum surface with either ammonia or a $N_2H_2$ mixture (in either of the previously described embodiments), it has been found to be highly desirable to additionally passivate the aluminum surface using only nitrogen ($N_2$) gas. If ammonia ($NH_3$) is used during the treatment step, it is replaced by a flow of nitrogen during this passivation step. If a $N_2/H_2$ mixture is used in the treatment step, the flow of hydrogen ($H_2$) is shut off for this passivation step.

This passivation step may begin after at least a minimum treatment step time of at least about 10 seconds. The treatment step may be carried out for a longer period before commencing the passivation step. During this passivation step, the flow of nitrogen ($N_2$) gas should be at least about 100 sccm or higher and preferably is increased up to at least about 250 sccm. The passivation step is preferably carried out for a period of at least about 5 seconds, although longer periods of time could be utilized.

To further illustrate the treatment process of the invention, in particular for the treatment of aluminum surfaces in a vacuum chamber used for the CVD deposition of tungsten metal, a 6 liter chamber in which tungsten had been deposited on a semiconductor wafer, e.g., from a $WF_6$ gaseous tungsten source, was first cleaned by flowing about 200 sccm of $NF_3$ through the chamber as the source of fluorine gas, as described in the aforementioned Chang Ser. No. 07/398,689 application, while maintaining the chamber at a pressure of 0.75 Torr and at a temperature at about 450° C. A plasma was ignited in the chamber during the cleaning gas flow and the plasma was maintained in the chamber at a power level of about 200 watts for about 2 minutes, after which the plasma was extinguished and the flow of cleaning gas was subsequently shut off.

Fluorine residues remaining in the chamber were then removed, and the aluminum surfaces in the chamber treated, in accordance with the invention, by flowing 30 sccm of $N_2$ and 500 sccm of $H_2$ into the chamber and igniting a plasma at a power level of 200 watts. The chamber pressure was maintained at level of about 500 milliTorr during this treatment, which was carried out for a period of about 10 seconds. The hydrogen flow was then discontinued and the nitrogen flow was increased to 250 sccm to passivate the treated aluminum surface for a period of 5 seconds after which the plasma was extinguished. The flow of nitrogen gas was then shut off.

Subsequent to this, a wafer was mounted on the susceptor in the cleaned and treated chamber and a layer of tungsten was CVD applied to the wafer surface. The wafer was then removed from the deposition chamber and examined. The tungsten layer showed no ill effects from the nitrogen treatment of the chamber.

The chamber itself was examined, after the tungsten deposition, for signs of aluminum deposition or particles resulting from sublimation and/or vaporization of the aluminum in the chamber, e.g., from the heated aluminum susceptor, and the chamber was found to be free of perceivable amounts of aluminum deposits or particles. The same results may be obtained if ammonia is substituted for the nitrogen/hydrogen gas mixture during the treatment carried out in accordance with the invention.

To illustrate the difference in result when the initial flow of nitrogen exceeded 30 sccm during the first 10 seconds of the treatment, the same treatment was carried out on the chamber as described above, except that the initial flow of nitrogen into the chamber during the first 10 seconds of treatment was 100 sccm. When tungsten was then subsequently deposited on a semiconductor wafer and the deposited tungsten layer examined, it was found to be nonuniform in film thickness and particle generation was also noted.

Thus, the invention, in its broadest aspects, provides a treatment method for aluminum surfaces in a vacuum chamber used for the deposition and/or etching of materials on a semiconductor wafer to inhibit vaporization and/or sublimation of the aluminum during subsequent processing wherein portions of the aluminum in the chamber may be heated to temperatures in excess of about 400° C.

In a particularly preferred embodiment, the treatment can be used on aluminum surfaces in a vacuum chamber used for the deposition of tungsten by careful control of the initial flow of the nitrogen-containing gas used in the treatment.

Having thus described the invention what is claimed is:

1. A process for treatment of an aluminum surface in a vacuum chamber used for the processing of materials on a semiconductor wafer which comprises:
   a) flowing into said chamber one or more gases, including a nitrogen-containing gas, selected from the group consisting of:
      i) a mixture of nitrogen ($N_2$) and hydrogen ($H_2$); and
      ii) ammonia ($NH_3$); and
   b) igniting a plasma in said chamber and maintaining said plasma in said chamber during said flow of said nitrogen-containing gas into said chamber.

2. The process of claim 1 wherein said nitrogen-containing gas is flowed into said chamber at a rate equivalent to a rate of at least about 20 scm flowing into a chamber having a volume of about 6 liters.

3. The process of claim 2 wherein said treatment process is carried out for a period of at least about 10 seconds.

4. The process of claim 2 wherein the pressure in said chamber is maintained within a range of from about 200 milliTorr to about 2 Torr during said treatment.

5. The process of claim 2 wherein the temperature in said chamber is maintained within a range of from about 150° C. to about 525° C. during said treatment.

6. The process of claim 2 wherein said plasma is maintained within said chamber at a power level during said treatment equivalent to a power level of from about 100 to about 400 watts in a vacuum chamber having a volume of about 6 liters.

7. The process of claim 2 wherein said nitrogen-containing gas comprises nitrogen ($N_2$) and hydrogen is also flowed into said chamber during said treatment at a rate within a range equivalent to the flow of from about 250 sccm to about 1000 sccm into a chamber having a volume of 6 liters.

8. The process of claim 2 wherein a passivation step is carried out for an additional time period of at least about 5 seconds after said treatment step by flowing only nitrogen ($N_2$) into said chamber at a flow rate equivalent to a rate of at least about 100 sccm flowing into a chamber having a volume of 6 liters.

9. The process of claim 2 wherein said vacuum chamber is used for the deposition of tungsten and said flow of nitrogen-containing gas into said chamber for at least the first 10 seconds of the treatment does not exceed a rate equivalent to the flow of about 30 sccm into a chamber having a volume of 6 liters when nitrogen ($N_2$) is the nitrogen-containing gas; and hydrogen ($H_2$) is also flowed into said chamber during said treatment, at a minimum rate equivalent to a rate of at least 50 sccm flowing into a chamber having a volume of 6 liters.

10. The process of claim 9 wherein the flow of said nitrogen ($N_2$) gas during any additional time period beyond said 10 second period may exceed said 30 sccm maximum of said initial 10 second treatment period.

11. The process of claim 2 wherein said vacuum chamber is used for the deposition of tungsten and said flow of nitrogen-containing gas into said chamber for at least the first 10 seconds of the treatment does not exceed a rate equivalent to the flow of 50 sccm into a chamber having a 'volume of 6 liters when ammonia ($NH_3$) is the nitrogen-containing gas.

12. The process of claim 11 wherein the flow of said ammonia gas during any additional time period beyond said 10 second period may exceed said 50 sccm maximum of said initial i0 second treatment period.

13. A process for treatment of aluminum surfaces in a vacuum chamber used for the processing of materials on a semiconductor wafer which treatment process comprises:
   a) flowing into said chamber one or more gases, including a nitrogen-containing gas, said one or more gases selected from the group consisting of:
      i) a mixture of nitrogen ($N_2$) and hydrogen ($H_2$); and
      ii) ammonia ($NH_3$) at a rate equivalent to a rate of at least about 20 sccm flowing into a chamber having a volume of about 6 liters.
   b) igniting a plasma in said chamber and maintaining said plasma in said chamber during said flow of said nitrogen-containing gas into said chamber at a power level during said treatment equivalent to a power level of from about 100 to about 400 watts in a vacuum chamber having a volume of about 6 liters; and
   c) maintaining said treatment for a period of at least about 10 seconds.

14. The process of claim 13 wherein the pressure in said chamber is maintained within a range of from about 200 milliTorr to about 2 Torr during said treatment.

15. The process of claim 13 wherein the pressure in said chamber is maintained within a range of from about 125° C. to about 525° C. during said treatment.

16. The process of claim 13 wherein a passivation step is carried out for a time period of at least about 5 seconds after said treatment step by flowing only nitrogen ($N_2$) gas into said chamber during said additional time period.

17. A process for treatment of aluminum surfaces in a vacuum chamber used for the deposition of tungsten on a semiconductor wafer, which treatment process comprises:
  a) flowing nitrogen ($N_2$) into said chamber at a rate equivalent to a rate not exceeding about 30 sccm flowing into a chamber having a volume of about 6 liters;
  b) flowing hydrogen ($H_2$) gas into said chamber at a minimum rate equivalent to a rate of at least about 50 sccm flowing into a chamber having a volume of 6 liters;
  c) igniting a plasma in said chamber and maintaining said plasma in said chamber during said flow of said nitrogen gas into said chamber at a power level during said treatment equivalent to a power level of from about 100 to about 400 watts in a vacuum chamber having a volume of about 6 liters; and
  d) maintaining said treatment for a period of at least about 10 seconds.

18. The process of claim 17 wherein a passivation step is carried out for a time period of at least about 5 seconds after said treatment step by flowing only nitrogen ($N_2$) gas into said chamber during said additional time period.

19. A process for treatment of aluminum surfaces in a vacuum chamber used for the deposition of tungsten on a semiconductor wafer, which treatment process comprises:
  a) flowing ammonia ($NH_3$) into said chamber at a rate equivalent to a rate not exceeding about 50 sccm flowing into a chamber having a volume of about 6 liters;
  b) igniting a plasma in said chamber and maintaining said plasma in said chamber during said flow of said ammonia gas into said chamber at a power level during said treatment equivalent to a power level of from about 100 to about 400 watts in a vacuum chamber having a volume of about 6 liters; and
  c) maintaining said treatment for a period of at least about 10 seconds.

20. The process of claim 19 wherein a passivation step is carried out for a time period of at least about 5 seconds after said treatment step by flowing nitrogen ($N_2$) gas into said chamber during said additional time period.

21. A process for treatment of an aluminum surface into a vacuum chamber used for the processing of materials on a semiconductor wafer which comprises:
  a) flowing a nitrogen-containing gas selected from the group consisting of nitrogen ($N_2$) and ammonia ($NH_3$) into said chamber; and
  b) igniting a plasma in said chamber and maintaining said plasma in said chamber during said flow of said nitrogen-containing gas into said chamber.

* * * * *